(12) United States Patent
Takeuchi

(10) Patent No.: US 7,339,406 B2
(45) Date of Patent: Mar. 4, 2008

(54) SAWTOOTH WAVE GENERATING APPARATUS, A METHOD OF GENERATING SAWTOOTH WAVE, A CONSTANT CURRENT CIRCUIT, AND A METHOD OF ADJUSTING AMOUNT OF CURRENT FROM THE SAME

(75) Inventor: Kesatoshi Takeuchi, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/535,575

(22) PCT Filed: Dec. 25, 2003

(86) PCT No.: PCT/JP03/16823

§ 371 (c)(1),
(2), (4) Date: May 19, 2005

(87) PCT Pub. No.: WO2004/062104

PCT Pub. Date: Jul. 22, 2004

(65) Prior Publication Data

US 2006/0091874 A1    May 4, 2006

(30) Foreign Application Priority Data

Dec. 27, 2002    (JP) .............................. 2002-382475

(51) Int. Cl.
*H03K 4/06*    (2006.01)

(52) U.S. Cl. ...................... 327/134; 327/131; 327/172; 327/175

(58) Field of Classification Search ................ 327/362, 327/126, 127, 131–137, 172–175
See application file for complete search history.

(56) References Cited

U.S. PATENT DOCUMENTS 3,914,623 A  *  10/1975  Clancy .................... 327/134
4,268,794 A  *   5/1981  Handte et al. ............ 327/134
5,083,079 A      1/1992  Plants (Continued)

FOREIGN PATENT DOCUMENTS

DE    36 07 217 A    9/1987

(Continued)

OTHER PUBLICATIONS

Knopper G. J. ; "Triggered Sawtooth Generator", Elektor Electronics, Elektor Publishers Ltd., Canterbury, GB, vol. 17. No. 191, Jul. 1, 1991, pp. 66-67, XP000235698.

*Primary Examiner*—Dinh T. Le
(74) *Attorney, Agent, or Firm*—Harness, Dickey & Pierce, P.L.C.

(57) ABSTRACT

A sawtooth wave generating apparatus includes a base frequency generating section and a frequency generating section for generating the frequency of a reference signal, a sawtooth wave forming section which forms a sawtooth wave based on the reference signal, a voltage comparator which compares the voltage value of the sawtooth wave formed by the sawtooth wave forming section with a predetermined voltage value, a phase comparator which compares the phase of the output signal from the voltage comparator with the phase of the reference signal, and a low-pass filter (LPF) which cuts out a high frequency component of the output signal from the phase comparator, and feeds back the resulting output signal to the sawtooth wave forming section.

9 Claims, 7 Drawing Sheets

U.S. PATENT DOCUMENTS

| | | | |
|---|---|---|---|
| 5,179,321 A * | 1/1993 | Smith et al. ................. | 315/398 |
| 5,455,493 A | 10/1995 | Pulluru et al. | |
| 5,469,092 A | 11/1995 | Itakura | |
| 5,557,241 A * | 9/1996 | Burke ........................... | 331/4 |
| 6,147,550 A | 11/2000 | Holloway | |
| 6,265,929 B1 | 7/2001 | Hauser | |
| 6,369,665 B1 | 4/2002 | Chee et al. | |
| 6,791,405 B2 * | 9/2004 | Tsuji et al. ................... | 330/10 |

FOREIGN PATENT DOCUMENTS

| | | |
|---|---|---|
| EP | 0 574 982 A | 12/1993 |
| JP | 03-243183 | 10/1991 |
| JP | 03-289375 | 12/1991 |
| JP | 11-180529 | 7/1999 |
| JP | 2000-175447 | 6/2000 |
| WO | 93/24996 A | 12/1993 |

* cited by examiner

US 7,339,406 B2

SAWTOOTH WAVE GENERATING APPARATUS, A METHOD OF GENERATING SAWTOOTH WAVE, A CONSTANT CURRENT CIRCUIT, AND A METHOD OF ADJUSTING AMOUNT OF CURRENT FROM THE SAME

TECHNICAL FIELD

The present invention relates to a sawtooth wave generating apparatus, a method of generating sawtooth wave, a constant current circuit, and a method of adjusting the amount of current from the same, more particularly, to such an apparatus and a method which are used in a PWM driving device, a PWM display device, or the like.

BACKGROUND ART

In a conventional sawtooth wave generating apparatus, a signal having a desired reference frequency is generated using a fixed oscillation frequency of an oscillator such as a crystal oscillator, and then a sawtooth wave is generated using the signal having the desired reference frequency. The structure of a conventional sawtooth wave generating apparatus will be described with reference to FIGS. 9 and 10.

FIG. 9 is a schematic block diagram of a conventional sawtooth wave generating apparatus 2. As shown in FIG. 9, the conventional sawtooth wave generating apparatus 2 includes a fixed frequency generating section 3 for generating a reference frequency fixed at a predetermined value using a crystal oscillator or the like, and a sawtooth wave generating section 4 for generating a sawtooth wave based on the reference frequency. In this way, since using a piezoelectric element or the like having a piezoelectric effect as a load, i.e., driving a load whose resonant point is changeable was not taken into consideration, such the fixed frequency generating section 3 has been utilized.

FIG. 10 is a circuit diagram illustrating an example of the circuit structure of the sawtooth wave generating section 4 shown in FIG. 9. As shown in FIG. 10, the sawtooth wave generating section 4 includes a variable resistor 4R whose resistive value can be changed manually, and a plurality of capacitors 4C each having a predetermined capacitance, one of which can be set (selected). In this case, in the sawtooth wave generating section 4 shown in FIG. 10, the shape of the sawtooth wave including a slope of the sawtooth wave is changeable by changing the resistive value of the variable resistor 4R, and the cycle of the sawtooth wave (the period between a rising edge and trailing edge of the sawtooth wave) is changeable by selecting one capacitor within the plurality of capacitors 4C.

The generated sawtooth wave is utilized in an apparatus carrying out the PWM control such as a PWM driving device or a PWM display device as disclosed in, for example, Japanese Laid-Open Patent Application No. HEI. 11-180529. The PWM control is one in which a signal having a predetermined duty ratio for controlling the drive of each of various devices is utilized to control ON/OFF of the device by comparing a predetermined voltage value with the voltage value of the sawtooth wave (voltage waveform) by means of a voltage comparator.

Further, in Japanese Laid-Open Patent Application No. HEI. 11-180529, a method of controlling the drive of elliptic-oscillation parts feeder using a resonant frequency is disclosed in which the resonant point is track-controlled using a variable frequency power supply.

However, in the conventional sawtooth wave generating apparatus 2, in the case where the PWM control is carried out in a driving device using the resonant point of a resonant device, a clear (or stable) sawtooth wave could not be formed because the resonant frequency is changeable.

Namely, the sawtooth wave generated from the resonant frequency of a resonant driving device was utilized in the PWM control. However, since the resonant frequency was changeable, the PWM control could not be stabilized at a predetermined duty ratio. Thus, there is a problem that the duty ratio is changed constantly in such a case.

Further, there is another problem that a stable sawtooth wave having a certain shape cannot be formed which becomes a reference signal of the PWM control because the resonant frequency for the PWM control is changed constantly.

DISCLOSURE OF INVENTION

In view of the above-mentioned problems of the prior art, it is therefore an object of the present invention to provide a sawtooth wave generating apparatus and a method of generating a sawtooth wave that can stably supply a sawtooth wave in response to variation in a resonant frequency in the case of PWM-controlling a driving device with a piezoelectric element whose resonant frequency constantly undergoes a change, or carrying out the PWM control by arbitrarily changing the resonant frequency.

In order to achieve the above object, in one aspect of the present invention, the present invention is directed to a sawtooth wave generating apparatus that can generate a sawtooth wave stably. The sawtooth wave generating apparatus comprises:

a reference signal generating section for generating a reference signal having a predetermined frequency;

a sawtooth wave forming section which forms a sawtooth wave based on the predetermined frequency of the reference signal generated by the reference signal generating section; and a correcting section which automatically corrects a slope of the sawtooth wave defined by $\Delta V/t$ which is formed by the sawtooth wave forming section in response to variation of the predetermined frequency of the reference signal.

In the sawtooth wave generating apparatus of the present invention, the reference signal having the predetermined frequency is generated by the reference signal generating section, the sawtooth wave is formed by the sawtooth wave forming section based on the predetermined frequency, and then the slope of the formed sawtooth wave, i.e., the value $\Delta V/t$ is automatically corrected by the correcting section. Thus, according to the sawtooth wave generating apparatus of the present invention, it is possible to stably supply a sawtooth wave in response to variation in a resonant frequency in the case of PWM-controlling a driving device with a piezoelectric element whose resonant frequency constantly undergoes a change, or carrying out the PWM control by arbitrarily changing the resonant frequency.

In this case, it is preferred that the reference signal is a square-wave having rising edges and trailing edges, and the correcting section comprises:

a voltage comparator which compares the voltage of the sawtooth wave formed by the sawtooth wave forming section with a predetermined voltage;

a phase comparator which compares the phase of the rising edge of the reference signal generated by the reference signal generating section with the phase of the output signal from the voltage comparator; and a low-pass filter which cuts out a high frequency component of the output signal from the phase comparator, and feeds back the resulting output signal to the sawtooth wave forming section.

Further, it is preferred that the phase comparator outputs a low-level signal so as to make the value $\Delta V/t$ smaller in the case where the phase of the output signal from the voltage comparator is earlier than the phase of the rising edge of the reference signal, and the phase comparator outputs a high-level signal so as to make the value $\Delta V/t$ larger in the case where the phase of the output signal from the voltage comparator is later than the phase of the rising edge of the reference signal.

Moreover, it is preferred that the reference signal generating section includes a base frequency generating section comprising a PLL circuit, and a frequency generating section for generating the reference signal based on the output signal from the base frequency generating section.

Further, it is preferred that the sawtooth wave forming section includes a constant current circuit which outputs a constant current, a capacitor which is charged by the output current from the constant current circuit, and a semiconductor device for discharging the electric charge stored in the capacitor.

In this case, it is preferred that the semiconductor device includes an IGFET.

Further, it is preferred that the sawtooth wave generating apparatus further comprises a sawtooth wave discharging pulse section which controls discharge timing of the electric charge stored in the capacitor by outputting an on/off signal for the semiconductor device based on the output signal from the voltage comparator.

Moreover, it is preferred that the constant current circuit is capable of controlling the amount of the output current based on the output signal from the low-pass filter.

Further, it is preferred that the constant current circuit comprises a constant voltage source which outputs a constant voltage, a second FET for using a constant current characteristic of drain current, and a first FET for controlling the drain current of the second FET, a source electrode of the first FET being connected to a source electrode of the second FET;

wherein a gate electrode of the first FET is connected to the output side of the low-pass filter to control the amount of the output current from the constant current circuit, and both a gate electrode of the second FET and a drain electrode of the first FET are connected to the constant voltage source.

Further, in another aspect of the present invention, the present invention is directed to a method of generating a sawtooth wave. The method comprises the steps of:

generating a reference signal having a predetermined frequency, the reference signal being a square-wave having rising edges and trailing edges;

forming a sawtooth wave based on the generated reference signal;

comparing the phase of the rising edge of the reference signal with the phase of the apex of the formed sawtooth wave; and automatically correcting a slope of the sawtooth wave defined by $\Delta V/t$ based on the result of the phase comparison.

In this case, it is preferred that the automatically correcting step comprises:

generating a pulse signal when the voltage value of the sawtooth wave reaches a predetermined voltage value;

comparing the phase of the pulse signal with the phase of the rising edge of the reference signal; and correcting the slope of the sawtooth wave so as to make the value $\Delta V/t$ smaller in the case where the phase of the pulse signal is earlier than the phase of the rising edge of the reference signal, and to make the value $\Delta V/t$ larger in the case where the phase of the pulse signal is later than the phase of the rising edge of the reference signal.

Further, in yet another aspect of the present invention, the present invention is directed to a constant current circuit which outputs a constant current. In this regard, a current control device which resides outside of the constant current circuit is capable of controlling the amount of the output current of the constant current circuit. The constant current circuit comprises:

a constant voltage source capable of outputting a constant voltage;

a second FET, a gate electrode of the second FET being connected to the output side of the constant voltage source, and a drain electrode of the second FET constituting an output terminal of the constant current circuit; and a first FET capable of controlling the amount of the output current from the drain electrode of the second FET based on a control signal inputted from the current control device, a drain electrode of the first FET being connected to the constant voltage source and a gate electrode of the second FET, and a gate electrode of the first FET being connected to the current control device.

In this case, it is preferred that the current control device includes a low-pass filter, and the control signal is a variable voltage signal to make the constant current circuit output a desired amount of current as the drain current of the second FET.

Moreover, in yet another aspect of the present invention, the present invention is directed to a method of adjusting the amount of an output current from a constant current circuit. In this regard, the constant current circuit includes a constant voltage source capable of outputting a constant voltage, a first FET, and a second FET. The method comprises:

adjusting the amount of a drain current of the second FET by changing the voltage applied to a gate electrode of the first FET, thereby changing the amount of the output current of the constant current circuit corresponding to the amount of the drain current.

BRIEF DESCRIPTION OF DRAWINGS

The foregoing and other objects, features and advantages of the invention will become more readily apparent from the following detailed description of a preferred embodiment of the invention which proceeds with reference to the accompanying drawings.

BEST MODE FOR CARRYING OUT THE INVENTION

A detailed description of the preferred embodiments of a sawtooth wave generating apparatus and a method of generating a sawtooth wave according to the present invention will now be made with reference to FIGS. 1-8. Now, it should be noted that the embodiments (disclosure) are to be considered as an exemplification, and therefore this feature should not be intended to limit the present invention to the specific embodiments illustrated.

Figure 1:
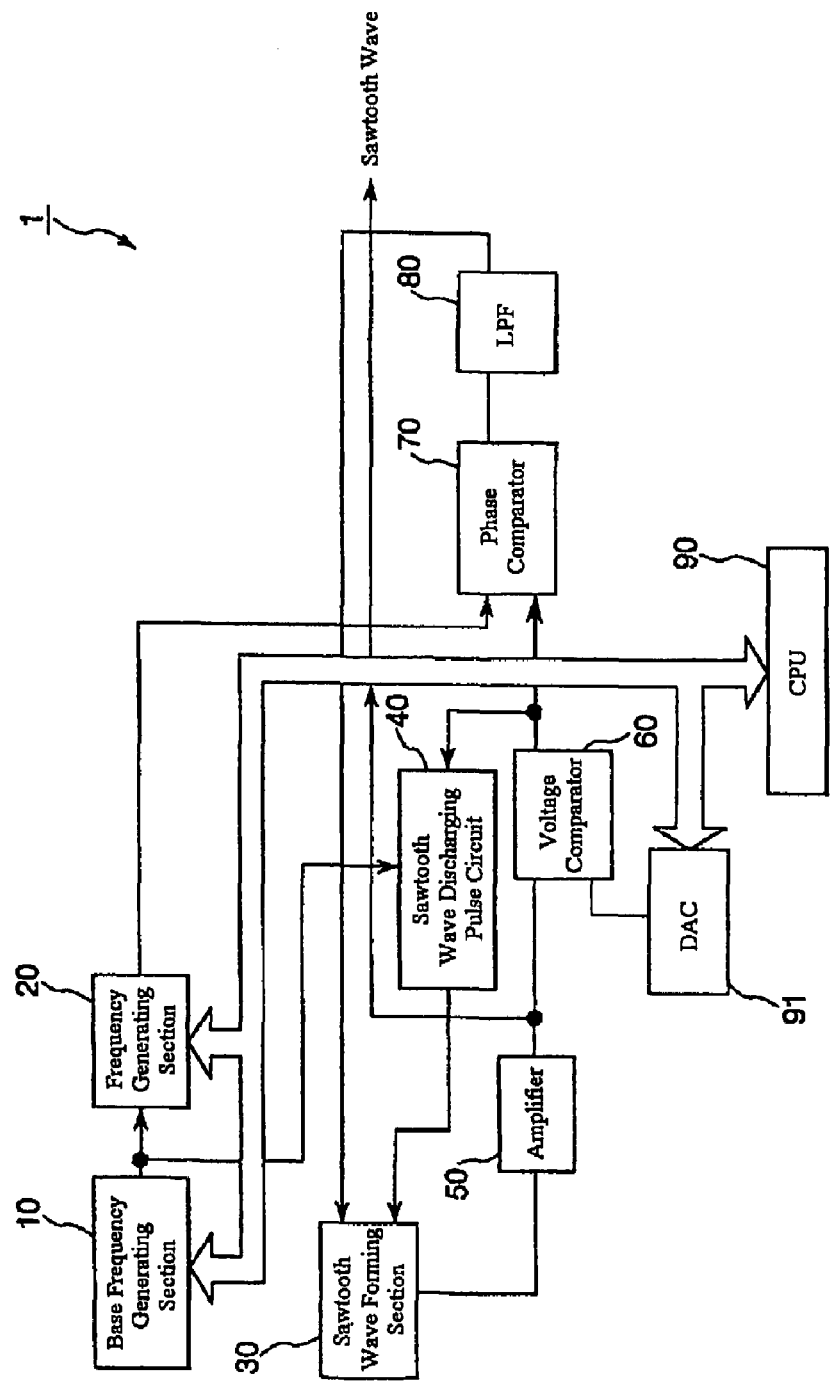
FIG. 1 is a schematic block diagram illustrating a main portion (circuit diagram) of a sawtooth wave generating apparatus according to the present invention.

First, a description will be given for the structure of a sawtooth wave generating apparatus 1 of the present invention. FIG. 1 is a schematic block diagram illustrating a main portion (circuit diagram) of a sawtooth wave generating apparatus 1 according to the present invention. As shown in FIG. 1, the sawtooth wave generating apparatus 1 of the present invention includes a base frequency generating section 10, a frequency generating section 20, a sawtooth wave forming section 30, a sawtooth wave discharging pulse circuit 40, an amplifier 50, a voltage comparator 60, a phase comparator 70, and a low-pass filter (LPF) 80. Further, the sawtooth wave generating apparatus 1 includes a digital-analog converter (DAC) 91, and a central processing unit (CPU) 90 connected to the DAC 91, the base frequency generating section 10 and the frequency generating section 20 for controlling them. A detailed description of each component is given below with reference to FIGS. 2-5.

The base frequency generating section 10 is shown as a phase lock loop (PLL) circuit including a crystal oscillator in the present embodiment. However, the present invention is not limited to this structure, but a PLL circuit using other oscillator may be utilized if the oscillating frequency thereof is stable. Further, in the case where the reference frequency undergoes a change due to disturbance or the like, the sawtooth wave generating apparatus 1 can be utilized effectively because it can outputs a stable sawtooth wave.

Figure 2:
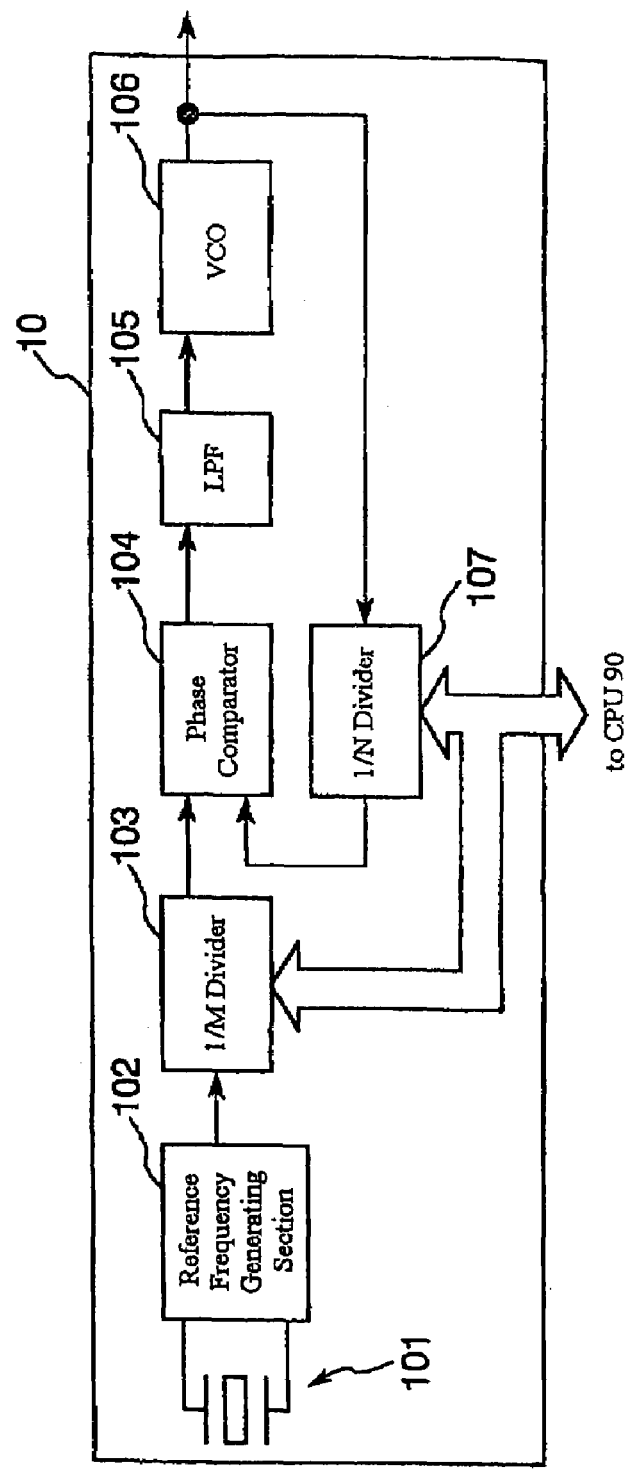
FIG. 2 is a block diagram schematically illustrating a base frequency generating section in the sawtooth wave generating apparatus shown in FIG. 1.

FIG. 2 is a block diagram schematically illustrating a base frequency generating section 10 in the sawtooth wave generating apparatus 1 shown in FIG. 1. As shown in FIG. 2, the base frequency generating section 10 includes a crystal oscillator 101, a reference frequency generating section 102, 1/M divider 103, a phase comparator 104, an LPF 105, a voltage controlled oscillator (VCO) 106, and 1/N divider 107. The values M, N that are respectively dividing ratios of the 1/M divider 103 and 1/N divider 107 are controlled by the CPU 90. In this way, the base frequency generating section 10 generates a signal having a desired base frequency by appropriately changing the dividing ratios M, N of two dividers 103, 107, and outputs the signal to the frequency generating section 20.

Namely, a predetermined frequency of the signal outputted from the reference frequency generating section 102 based on the oscillating frequency of the crystal oscillator 101 is divided into 1/M by means of the 1/M divider 103 to input the divided signal to one input terminal of the phase comparator 104. The output signal from the base frequency generating section 10, i.e., the output signal from the VCO 106 is inputted to the 1/N divider 107 through a feedback loop, and the output signal from the VCO 106 that undergoes 1/N dividing operation by the 1/N divider 107 is inputted to another input terminal of the phase comparator 104.

The phase comparator 104 compares the phases (i.e., frequencies) of the two input signal mentioned above to output a comparison signal (comparing result) to the LPF 105. The VCO 106 adjusts the output signal based on the comparison signal whose high frequency component is cut out by the LPF 105, and finally the signal having the frequency as N/M times as the frequency of the signal generated in the reference frequency generating section 102 is outputted to the frequency generating section 20.

Figure 3:
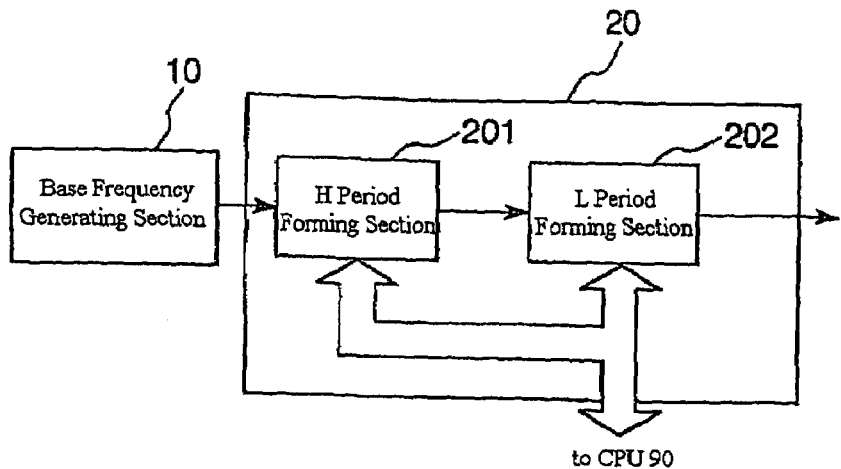
FIG. 3 is a block diagram schematically illustrating a frequency generating section in the sawtooth wave generating apparatus shown in FIG. 1.

FIG. 3 is a block diagram schematically illustrating the frequency generating section 20 in the sawtooth wave generating apparatus 1 shown in FIG. 1. As shown in FIG. 3, the frequency generating section 20 includes an H period forming section 201 and an L period forming section 202. Each of the H and L period forming sections 201, 202 is controlled by the CPU 90. Thus, the frequency generating section 20 outputs a reference signal having a predetermined frequency to one input terminal of the phase comparator 70. As seen from FIGS. 6 and 7, the reference signal is a square-wave which alternately assumes two fixed values (i.e., high level and low level).

Figure 8:
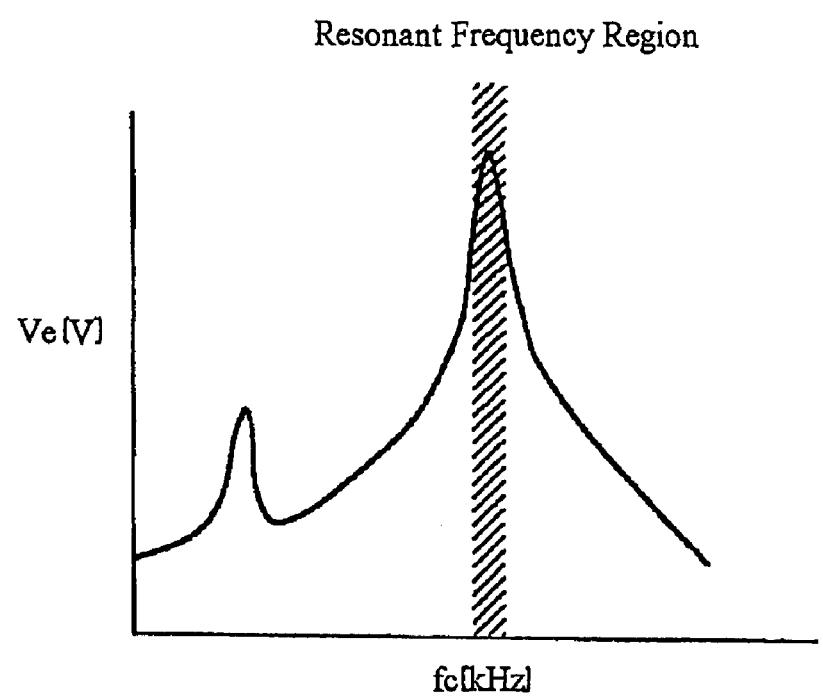
FIG. 8 is a graph illustrating a resonant frequency characteristic of a piezoelectric element.
Figure 9:
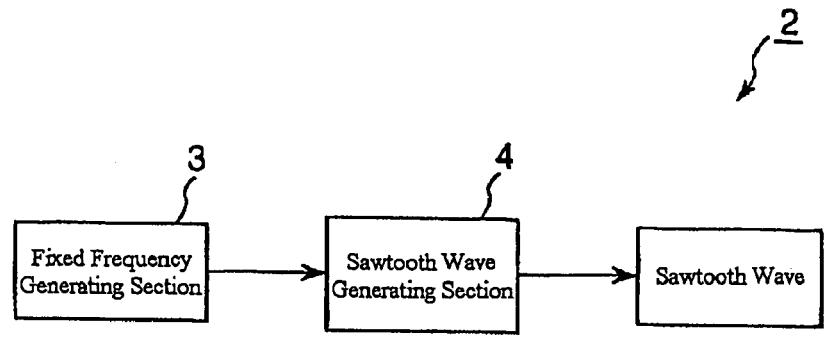
FIG. 9 is a schematic block diagram of a conventional sawtooth wave generating apparatus.
Figure 10:
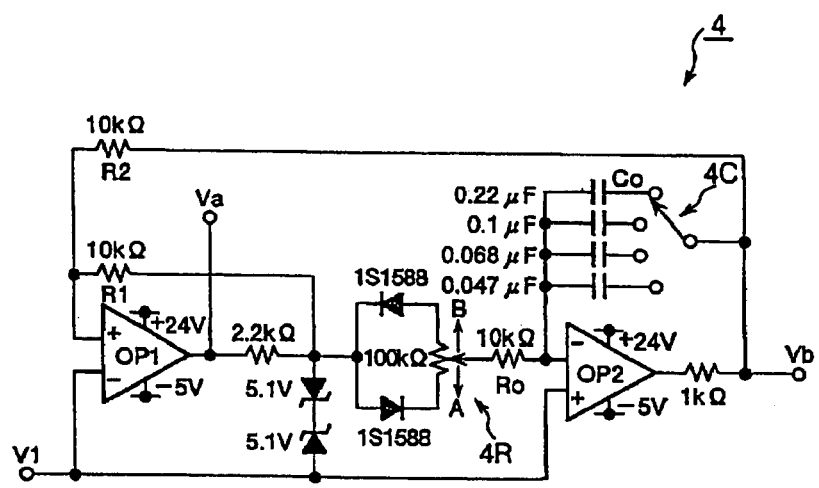
FIG. 10 is a circuit diagram illustrating an example of the circuit structure of a sawtooth wave generating section shown in FIG. 9.

Here, A description will be given for a resonant frequency characteristic in the case of using a piezoelectric element having a piezoelectric effect as a load. FIG. 8 is a graph illustrating a resonant frequency characteristic of a piezoelectric element. As shown in FIG. 8, the piezoelectric element utilized as the load has a resonant point (i.e., resonant frequency fc) within a resonant frequency region. The resonant point depends on physical conditions such as a shape of a rotor, a wearing state of the rotor, humidity, load characteristic, or the like in the driving device with a piezoelectric element whose resonant frequency constantly undergoes a change.

In this regard, in the case where the sawtooth wave generating apparatus 1 of the present invention drives a piezoelectric element as a load, the sawtooth wave generating apparatus 1 must change the frequency of the reference signal outputted from the above-mentioned base frequency generating section 10 in response to the variation of the resonant frequency. Because the sawtooth wave generating apparatus 1 cannot carry out the PWM control accurately if the frequency of the drive signal for controlling the piezoelectric element, i.e., the resonant frequency shown in FIG. 8 does not correspond with the frequency of the sawtooth wave output signal that is an output signal from the sawtooth wave generating apparatus 1. In this case, when the CPU 90 receives the signal indicating that the resonant frequency of the piezoelectric element undergoes a change, the CPU 90 adjusts the frequency of the output signal from the base frequency generating section 10 by appropriately changing the dividing rate(s) of the 1/M divider 103 and/or 1/N divider 107 in the base frequency generating section 10.

In this way, the sawtooth wave generating apparatus 1 of the present invention can arbitrarily set the frequency of the drive signal by changing the frequency of the output signal from the base frequency generating section 10 in response to the variation of the resonant frequency of the load (i.e., piezoelectric load), and changing the H period and L period of the frequency generating section 20 by control of the CPU 90.

Figure 4:
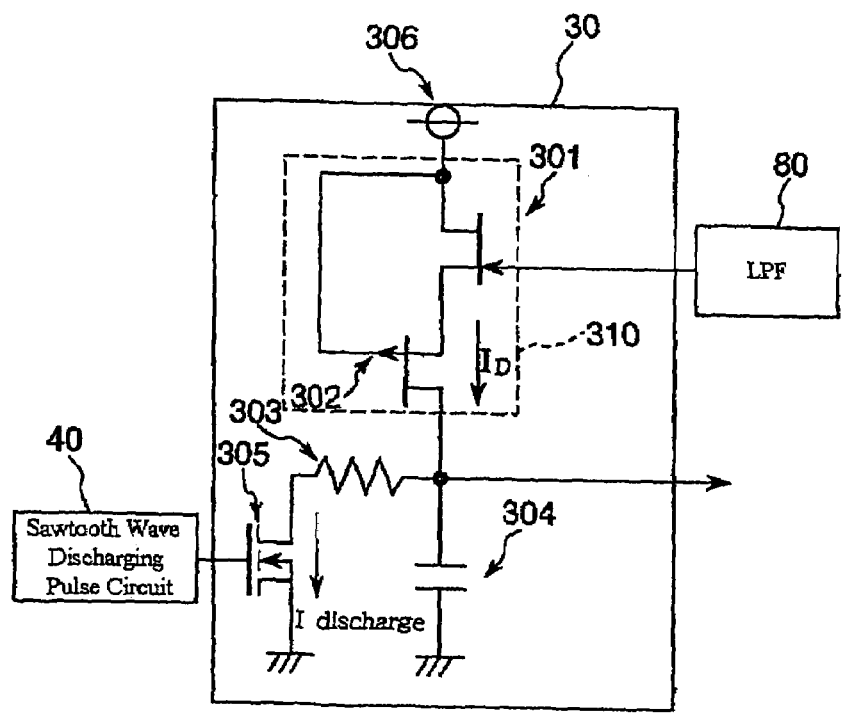
FIG. 4 is a block diagram schematically illustrating a sawtooth wave forming section in the sawtooth wave generating apparatus shown in FIG. 1.

FIG. 4 is a block diagram schematically illustrating a sawtooth wave forming section 30 in the sawtooth wave generating apparatus 1 shown in FIG. 1. As shown in FIG. 4, the sawtooth wave forming section 30 includes a first field-effect transistor (FET) 301, a second field-effect transistor (FET) 302, a resistor 303, a capacitor 304, an insulated gate FET (IGFET) 305 that is a semiconductor device, and a voltage source (ideal) 306.

A gate electrode of the first FET 301 is connected to the output side of the LPF 80, and a source and drain electrodes of the first FET 301 are respectively connected to a source electrode of the second FET 302 and the voltage source 306.

A gate electrode of the second FET 302 is connected to the drain electrode of the first FET 301 and the voltage source 306. A drain electrode of the second FET 302 is connected to one terminal of the resistor 303 and one conducting surface of the capacitor 304. The drain electrode of the second FET 302 is also connected to the amplifier 50. Further, the other terminal of the resistor 303 is connected to one terminal of the IGFET 305, and both the other conducting surface of the capacitor 304 and the other terminal of the IGFET 305 are connected to ground.

The first and second FETs 301, 302, and the constant voltage source 306 constitute a constant current circuit 310 that outputs a current $I_D$ having a predetermined constant current value in response to the output signal from the LPF 80. The constant current circuit 310 can control the amount of the output current $I_D$ by changing the amount of the drain current of the second FET 302 within the range less than the maximum value of the drain current of the second FET 302, which is determined by the voltage applied from the voltage source 306, based on the output signal (voltage value) from the LPF 80. In the present embodiment, the output signal from the LPF 80 may be regarded as a control signal of a current control device (not shown) for controlling the amount of the output current from the constant current circuit 310. In this case, the current $I_D$ outputted from the constant current circuit 310 can be controlled using this control signal. In the case where the output signal from the LPF 80 is a high level, the voltage applied to the gate electrode of the first FET 301 is increased according to the duration when the output signal remains the high level, and accordingly the drain current flowing between the source and drain electrodes of the second FET 302 is increased. On the other hand, in the case where the output signal from the LPF 80 is a low level, the voltage applied to the gate electrode of the first FET 301 is decreased according to the duration when the output signal remains the low level, and accordingly the drain current flowing between the source and drain electrodes of the second FET 302 is decreased.

The IGFET 305 is on/off-controlled based on the output signal from the sawtooth wave discharging pulse circuit 40, which is connected to a gate electrode of the IGFET 305. When the IGFET 305 is turned off, i.e., when the drain current of the IGFET 305 does not flow, the constant current flows from the constant current circuit 310 to the capacitor 304, thereby charging the capacitor 304 linearly. The electric charge Q stored in the capacitor 304 is indicated by the current $I_D$ times time t. The potential difference between the conducting surfaces of the capacitor 304, which is indicated by Q/C (where C is a capacitance of the capacitor 304), becomes an output signal from the sawtooth wave forming section 30, and then a line having a slope defined by ΔV/t that is a part of the sawtooth wave is formed based on this output signal.

When the IGFET 305 is turned on after the elapse of a predetermined time, the electric charge stored in the capacitor 304 is instantaneously discharged through the resistor 303 and the IGFET 305 (where a discharge current is $I_{discharge}$), and then the output signal (voltage signal) becomes zero. By repeating this process periodically, the output signal of a sawtooth wave is formed in the sawtooth wave forming section 30. The formed sawtooth wave is outputted to the amplifier 50, and amplified by the amplifier 50. The amplified sawtooth wave becomes an output signal of the sawtooth wave generating apparatus 1, i.e., a sawtooth wave output signal.

The voltage comparator 60 compares the voltage of the output signal (voltage signal) from the amplifier 50 (i.e., the voltage of a sawtooth wave output voltage signal) with the voltage of an output signal from the DAC 91 (i.e., the voltage of a given voltage signal). When the sawtooth wave output voltage signal is larger than the given voltage signal, the voltage comparator 60 outputs a high-level signal to the sawtooth wave discharging pulse circuit 40 and the phase comparator 70.

Figure 5:
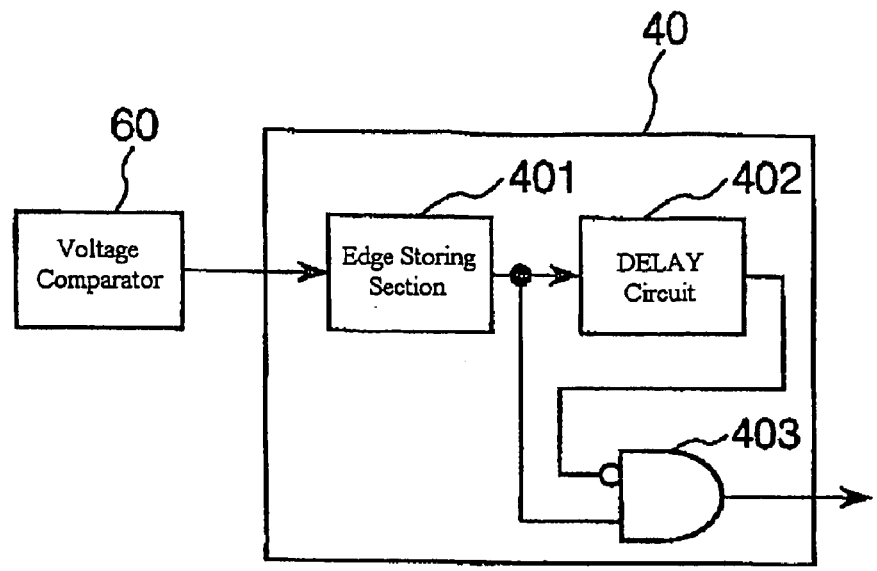
FIG. 5 is a block diagram schematically illustrating a sawtooth wave discharging pulse circuit in the sawtooth wave generating apparatus shown in FIG. 1.

FIG. 5 is a block diagram schematically illustrating a sawtooth wave discharging pulse circuit 40 in the sawtooth wave generating apparatus 1 shown in FIG. 1. As shown in FIG. 5, the sawtooth wave discharging pulse circuit 40 includes a edge storing section 401, a delay circuit 402, and an AND circuit 403 which carries out the logical multiplication of the output signal from the edge storing section 401 and the inverted output signal of the delay circuit 402. The sawtooth wave discharging pulse circuit 40 outputs a signal for forming the edge of the sawtooth wave to be formed in the sawtooth wave forming section 30 to the sawtooth wave forming section 30 in response to the output signal from the voltage comparator 60.

To be more precise, when the output signal from the voltage comparator 60 is a high level, i.e., when the sawtooth wave output signal (voltage signal) reaches over the predetermined voltage value, the edge storing section 401 into which the high-level signal is inputted holds the high-level signal to output the signal to both the delay circuit 402 and the AND circuit 403 using the output signal from the base frequency generating section 10 as a clock signal (see FIG. 1). The delay circuit 402 delays the inputted signal for a predetermined time to output the delayed signal to the AND circuit 403. Then, the AND circuit 403 carries out the logical multiplication of the output signal from the edge storing section 401 and the inverted output signal of the delay circuit 402 to output a pulse signal each pulse having a width corresponding to the predetermined time to the sawtooth wave forming section 30. Namely, the pulse signal is the output signal from the sawtooth wave discharging pulse circuit 40.

The phase comparator 70 compares the phase of a rising edge of the reference signal outputted from the frequency generating section 20 with the phase of a voltage comparison signal outputted from the voltage comparator 60. The phase comparator 70 outputs a low-level signal to the LPF 80 for the time corresponding to the phase delay between the two signals in the case where the frequency of the voltage comparison signal is higher than the frequency of the reference signal. On the other hand, the phase comparator 70 outputs a high-level signal to the LPF 80 for the time corresponding to the phase lead between the two signals in the case where the frequency of the voltage comparison signal is lower than the frequency of the reference signal.

The LPF 80 cuts out a high frequency component of the output signal from the phase comparator 70, and outputs (feeds back) the resulting output signal to the gate electrode of the first FET 301 in the sawtooth wave forming section 30 as mentioned above.

In this regard, the base frequency generating section 10 and the frequency generating section 20 constitute a reference signal generating section, and the voltage comparator 60, the phase comparator 70 and the LPF 80 constitute a correcting section.

Figure 6:
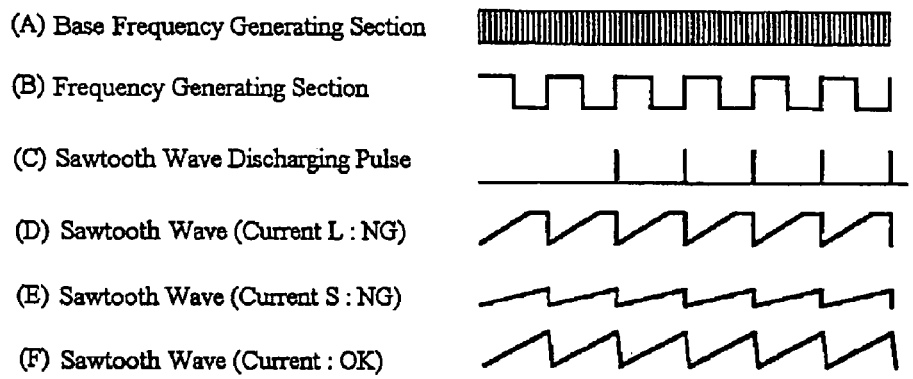
FIG. 6 shows timing charts schematically illustrating output signals from the base frequency generating section, the frequency generating section and the sawtooth wave discharging pulse circuit in the sawtooth wave generating apparatus shown in FIG. 1, and an output signal from the sawtooth wave generating apparatus shown in FIG. 1.

Next, a description will be given for the operation of the sawtooth wave generating apparatus 1 of the present invention with reference to timing charts of FIGS. 6 and 7. FIG. 6 shows timing charts schematically illustrating output signals from the base frequency generating section 10, the frequency generating section 20 and the sawtooth wave discharging pulse circuit 40 in the sawtooth wave generating apparatus 1 shown in FIG. 1, and an output signal from the sawtooth wave generating apparatus 1 shown in FIG. 1.

In the timing charts shown in FIG. 6, from the top of the figure, an output signal from the base frequency generating section 10 (see FIG. 6(A)), an output signal from the frequency generating section 20 (i.e., the reference signal) (see FIG. 6(B)), an output signal from the sawtooth wave discharging pulse circuit 40 (see FIG. 6(C)), and three patterns of an output signal from the sawtooth wave forming section 30 (i.e., the sawtooth wave output signal) (see FIGS. 6(D)-6(F)) are illustrated.

In this case, the three patterns illustrated in FIGS. 6(D)-6(F) respectively correspond to the case where a current value that is inputted to the capacitor 304 from the constant current circuit 310 is larger than a predetermined value, the case where the current value is smaller than the predetermined value, and the case where the current value is substantially equal to the predetermined value. In the case where the current value is equal to the predetermined value, the sawtooth wave is optimally formed.

As shown in these timing charts, the output signal from the sawtooth wave discharging pulse circuit 40 includes pulses in synchronization with the rising edges of a square-wave that is the output signal from the frequency generating section 20. Further, in synchronization with the pulse signal, the electrical charge stored in the capacitor 304 in the sawtooth wave forming section 30 is discharged, whereby the sawtooth wave output signal that is the output signal from the sawtooth wave forming section 30 is sharply fallen to its original state (namely, the voltage of the output signal becomes zero).

Further, as shown in FIG. 6(D), in the case where the output current value of the constant current circuit 310 is larger than the predetermined value, the amount of current flowing into the capacitor 304 becomes large, thereby making the slope of the sawtooth wave large, i.e., making the value $\Delta V/t$ larger (than the present value). Thus, the formed sawtooth wave increases at the timing earlier than a predetermined timing (i.e., the timing of the rising of the output signal from the frequency generating section 20) by rapidly charging the capacitor 304 in the sawtooth wave forming section 30, and then keeps at a substantially constant value (i.e., the output voltage value of the voltage source 306) until the sawtooth wave is fallen to the original state in synchronization with the pulse signal outputted from the sawtooth wave discharging pulse circuit 40. At this time, the slope of the sawtooth wave becomes substantially zero.

In contrast, as shown in FIG. 6(E), in the case where the output current value of the constant current circuit 310 is smaller than the predetermined value, the slope of the sawtooth wave becomes smaller than the case mentioned above. Thus, the formed sawtooth wave becomes one having a gentle slope (small slope) because the capacitor 304 is not charged enough at the predetermined timing. In this case, since the height of the top of the sawtooth wave is low, this sawtooth wave is not suitable for the PWM control in which the sawtooth wave is compared with a predetermined voltage value to drive a load.

As shown in FIG. 6(F), in the condition that the slope of the sawtooth wave and the generation timing of the sawtooth wave discharging pulse are preferable, the sawtooth wave forming section 30 can output a clear and suitable sawtooth wave to the amplifier 50.

Next, a detailed description will be given for the relationship of output signals from the components in the sawtooth wave generating apparatus 1 with reference to the timing charts shown in FIG. 7. FIG. 7 shows timing charts schematically illustrating output signals from the voltage comparator 60 and the phase comparator 70, which correspond to enlarged view of the timing charts shown in FIG. 6.

Figure 7:
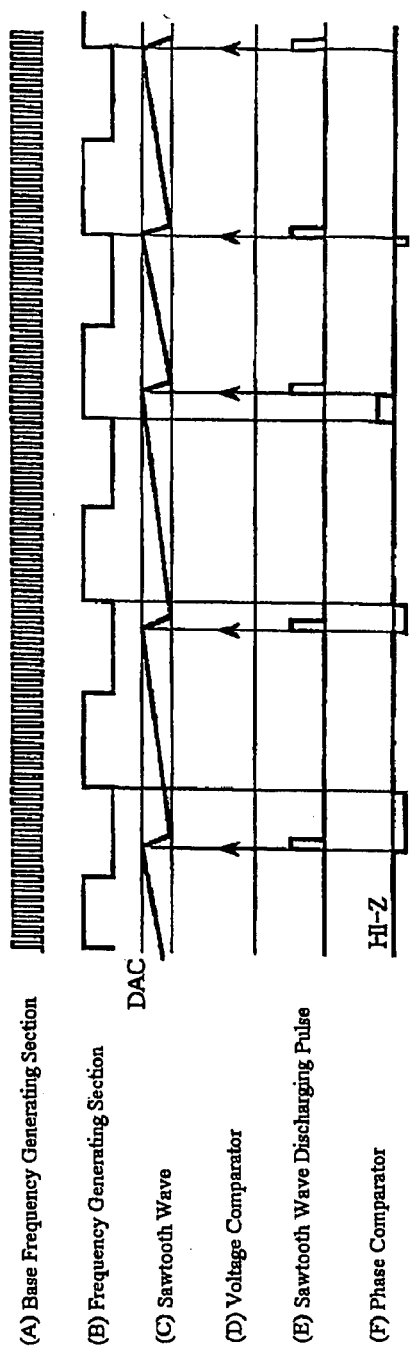
FIG. 7 shows timing charts schematically illustrating output signals from a voltage comparator and a phase comparator, which correspond to enlarged view of the timing charts shown in FIG. 6.

In the timing charts shown in FIG. 7, from the top of the figure, an output signal from the base frequency generating section 10 (see FIG. 7(A)), an output signal from the frequency generating section 20 (i.e., the reference signal) (see FIG. 7(B)), an output signal from the sawtooth wave forming section 30 (i.e., the sawtooth wave output signal) (see FIG. 7(C)), an output signal from the voltage comparator 60 (see FIG. 7(D)), an output signal from the sawtooth wave discharging pulse circuit 40 (see FIG. 7(E)), and an output signal from the phase comparator 70 (see FIG. 7(F)) are illustrated.

The reference line DAC shown in FIG. 7(C) indicates a reference voltage value inputted from the DAC 91 to the voltage comparator 60. When the output value of the sawtooth wave output signal is equal to the reference voltage value, the voltage comparator 60 outputs a pulse to the phase comparator 70 (see FIG. 7(D)). In synchronization with the pulse outputted from the voltage comparator 60, the sawtooth wave discharging pulse circuit 40 outputs a high-level signal, and keeps the high-level output for a predetermined time delayed by the delay circuit 402 (see FIG. 7(E)).

While the sawtooth wave discharging pulse circuit 40 outputs the high-level signal, the IGFET 305 in the sawtooth wave forming section 30 is turned on, whereby the electric charge stored in the capacitor 304 is rapidly discharged (see FIG. 7(C)).

In this regard, the time delayed by the delay circuit 402, i.e., the time when the output level of the sawtooth wave discharging pulse circuit 40 is high is appropriately set in consideration of the capacitance of the capacitor 304, the resistive value of the resistor 303, and the like.

Hereinafter, a description will be given for the operation of generating the sawtooth wave in the present embodiment according to the time series of the timing charts shown in FIG. 7.

The output signal from the base frequency generating section 10 is divided in the above-mentioned matter, thereby obtaining the output signal of the frequency generating section 20. The output signal from the frequency generating section 20 is a square-wave having a predetermined cycle (frequency) (see FIG. 7(B)). When the output value of the sawtooth wave output signal is equal to the reference voltage value of the DAC 91 (see FIG. 7(C)), the voltage comparator 60 outputs a pulse in timing with that time (see FIG. 7(D)).

When the pulse signal of the voltage comparator 60 is inputted to the sawtooth wave discharging pulse circuit 40, the sawtooth wave discharging pulse circuit 40 outputs a high-level signal for a predetermined time from the timing of the pulse signal by the setting of the delay circuit 402.

At the same time, the phase comparator 70 compares the timing in which the pulse signal is outputted from the voltage comparator 60 with the timing of the rising edge of the square-wave, i.e., the output signal from the frequency generating section 20 (reference signal). In the first sawtooth wave output signal, since the output timing of the voltage comparator 60 is earlier than the rising timing of the reference signal, the phase comparator 70 outputs a low-level signal to the sawtooth wave forming section 30 via the LPF 80 for the time corresponding to the time difference so as to make the slope of the sawtooth wave ($\Delta V/t$) smaller, i.e., to reduce the amount of current flowing to the capacitor 304 (see FIG. 7(F)).

The voltage applied to the gate electrode of the first FET 301 is lowered by a predetermined value in response to the output signal from the LPF 80, thereby lowering the output current of the constant current circuit 310. Thus, as the second sawtooth wave shown in FIG. 7(C), the slope of the sawtooth wave, i.e., $\Delta V/t$ is made smaller, thereby delaying the timing in which the reference voltage signal of the DAC 91 is equal to the sawtooth wave output signal.

Similarly, as shown in FIG. 7(C), since the output timing of the voltage comparator 60 is also earlier than the rising timing of the reference signal of the frequency generating section 20 in the second sawtooth wave, the phase comparator 70 outputs the low-level signal to the sawtooth wave forming section 30 via the LPF 80 for the time corresponding to the time difference. Thus, the slope of the sawtooth wave is further made smaller, and the timing in which the reference voltage signal of the DAC 91 is equal to the sawtooth wave output signal is further delayed.

In the third sawtooth wave, as mentioned above, by delaying the timing in which the reference voltage signal of the DAC 91 is equal to the sawtooth wave output signal, the rising timing of the reference signal of the frequency generating section 20 is earlier than the output timing of the voltage comparator 60 at this time. Therefore, to the contrary, the phase comparator 70 outputs a high-level signal for the time corresponding to the time difference (see FIG. 7(F)). Thus, the slope of the sawtooth wave is made larger, and the timing in which the reference voltage signal of the DAC 91 is equal to the sawtooth wave output signal is led.

Further, in the fourth sawtooth wave, to the contrary, since the output timing of the voltage comparator 60 is earlier than the rising timing of the reference signal of the frequency generating section 20, the phase comparator 70 outputs the low-level signal to the sawtooth wave forming section 30 via the LPF 80 for the time corresponding to the time difference. Thus, the slope of the sawtooth wave is made smaller, and the timing in which the reference voltage signal of the DAC 91 is equal to the sawtooth wave output signal is delayed.

Finally, in the fifth sawtooth wave, the rising timing of the reference signal of the frequency generating section 20 corresponds with the output timing of the voltage comparator 60. After this time, the sawtooth wave generating apparatus 1 (i.e., the sawtooth wave forming section 30) of the present invention can output (form) a good (clear) sawtooth wave output signal constantly unless disturbance or the like does not occur.

In this way, in the present invention, the reference signal having a given frequency is generated by the base frequency generating section 10 capable of generating the signal having a base frequency and the frequency generating section 20 capable of changing the base frequency of the output signal from the base frequency generating section 10 into the given frequency, a sawtooth wave is formed in the sawtooth wave forming section 30 based on the generated reference signal, the phase of the top (apex) of the formed sawtooth wave is compared with the phase of the rising edge of the reference signal in the phase comparator 70, and the slope of the sawtooth wave, i.e., $\Delta V/t$ is automatically corrected based on the result of the phase comparison.

Further, in the step of automatically correcting the slope $\Delta V/t$, the pulse signal is generated in the voltage comparator 60 when the voltage value of the formed sawtooth wave reaches a predetermined voltage value, and the phase of the pulse signal is compared with the phase of the rising edge of the reference signal in the phase comparator 70. Then, in the case where the phase of the pulse signal is earlier than the phase of the rising edge of the reference signal, the amount of current flowing to the capacitor 304 is decreased by decreasing the gate voltage of the first FET 301, thereby making the slope of the sawtooth wave smaller. On the other hand, in the case where the phase of the pulse signal is later than the phase of the rising edge of the reference signal, the amount of current flowing to the capacitor 304 is increased by increasing the gate voltage of the first FET 301, thereby making the slope of the sawtooth wave larger.

As described above, in the sawtooth wave generating apparatus 1 and the method of generating the sawtooth wave in the above-described embodiment of the present invention, the slope of the formed sawtooth wave can be automatically adjusted by comparing the timing of the trailing edge of the sawtooth wave outputted from the sawtooth wave forming section 30, i.e., the timing in which the voltage comparator 60 outputs a pulse signal with the timing of the rising edge of the reference signal outputted from the frequency generating section 20 by means of the phase comparator 70, feeding back the predetermined signal to the sawtooth wave forming section 30 based on the result of the phase comparison, and adjusting the output current of the constant current circuit 310.

Therefore, according to the sawtooth wave generating apparatus 1 and the method of generating the sawtooth wave of the present invention, a sawtooth wave can be stably supplied (outputted) in response to variation in the resonant frequency of the resonant device (piezoelectric element) in the case of PWM-controlling a driving device with the piezoelectric element whose resonant frequency constantly undergoes a change, or carrying out the PWM control by arbitrarily changing the resonant frequency.

It should be noted that, in the embodiments described above, the case where the reference frequency of the signal outputted from the reference frequency generating section 102 is changed in response to the variation in the resonant frequency of the piezoelectric element is described, but the present invention is not limited to this case. It is also possible to apply the sawtooth wave generating apparatus and the method of generating the sawtooth wave to the case where a distortion or the like occurs in the sawtooth wave output signal outputted from the sawtooth wave forming section 30 due to some sort of disturbance.

Further, in the present embodiment, the frequency generating section 20 divides the frequency of the signal outputted from the base frequency generating section 10 using the H period forming section 201 and the L period forming section 202, but the present invention is not limited to this structure. The frequency generating section 20 may be constructed to use a divider or the like.

As described above, it should be noted that, even though the sawtooth wave generating apparatus and the constant current circuit according to the present invention have been described with reference to the preferred embodiments shown in the accompanying drawings, the present invention is not limited to these embodiments, it is of course possible to make various changes and modifications to each element of sawtooth wave generating apparatus and the constant current circuit, and various elements described above can be replaced with any other element capable of performing the same or a similar function.

The invention claimed is:

1. A sawtooth wave generating apparatus which generates a sawtooth wave, the apparatus comprising:
   a reference signal generating section which generates a reference signal having a predetermined frequency;
   a sawtooth wave forming section which forms a sawtooth wave based on the predetermined frequency of the reference signal generated by the reference signal generating section; and
   a correcting section which automatically corrects a slope of the sawtooth wave defined by $\Delta V/t$ which is formed by the sawtooth wave forming section in response to variation of the predetermined frequency of the reference signal;
   wherein the reference signal is a square-wave having rising edges and trailing edges, and the correcting section comprises:
   a voltage comparator which compares the voltage of the sawtooth wave formed by the sawtooth wave forming section with a predetermined voltage;
   a phase comparator which compares the phase of the rising edge of the reference signal generated by the reference signal generating section with the phase of the output signal from the voltage comparator; and
   a low-pass filter which cuts out a high frequency component of the output signal from the phase comparator, and feeds back the resulting output signal to the sawtooth wave forming section.

2. The apparatus as claimed in claim 1, wherein the phase comparator outputs a low-level signal so as to make the value $\Delta V/t$ smaller in the case where the phase of the output signal from the voltage comparator is earlier than the phase of the rising edge of the reference signal, and the phase comparator outputs a high-level signal so as to make the value $\Delta V/t$ larger in the case where the phase of the output signal from the voltage comparator is later than the phase of the rising edge of the reference signal.

3. The apparatus as claimed in claim 1, wherein the reference signal generating section includes a base frequency generating section comprising a PLL circuit, and a frequency generating section which generates the reference signal based on the output signal from the base frequency generating section.

4. The apparatus as claimed in claim 1, wherein the sawtooth wave forming section includes a constant current circuit which outputs a constant current, a capacitor which is charged by the output current from the constant current circuit, and a semiconductor device which discharges an electric charge stored in the capacitor.

5. The apparatus as claimed in claim 4, wherein the semiconductor device includes an IGFET.

6. The apparatus as claimed in claim 4, further comprising a sawtooth wave discharging pulse section which controls discharge timing of the electric charge stored in the capacitor by outputting an on/off signal for the semiconductor device based on the output signal from the voltage comparator.

7. The apparatus as claimed in claim 4, wherein the constant current circuit is capable of controlling the amount of the output current based on the output signal from the low-pass filter.

8. The apparatus as claimed in claim 4, wherein the constant current circuit comprises a constant voltage source which outputs a constant voltage, a second FET for using a constant current characteristic of drain current, and a first FET for controlling the drain current of the second FET, a source electrode of the first FET being connected to a source electrode of the second FET;
   wherein a gate electrode of the first FET is connected to the output side of the low-pass filter to control the amount of the output current from the constant current circuit, and both a gate electrode of the second FET and a drain electrode of the first FET are connected to the constant voltage source.

9. A method of generating a sawtooth wave, the method comprising the steps of:
   generating a reference signal having a predetermined frequency, the reference signal being a square-wave having rising edges and trailing edges;
   forming a sawtooth wave based on the generated reference signal;
   comparing the phase of the rising edge of the reference signal with the phase of the apex of the formed sawtooth wave; and
   automatically correcting a slope of the sawtooth wave defined by $\Delta V/t$ based on the result of the phase comparison;
   wherein the automatically correcting step comprises:
   generating a pulse signal when the voltage value of the sawtooth wave reaches a predetermined voltage value;
   comparing the phase of the pulse signal with the phase of the rising edge of the reference signal; and
   correcting the slope of the sawtooth wave so as to make the value $\Delta V/t$ smaller in the case where the phase of the pulse signal is earlier than the phase of the rising edge of the reference signal, and to make the value $\Delta V/t$ larger in the case where the phase of the pulse signal is later than the phase of the rising edge of the reference signal.

* * * * *